United States Patent
Kannan et al.

(10) Patent No.: US 9,716,487 B1
(45) Date of Patent: Jul. 25, 2017

(54) LATENCY COMPENSATION NETWORK USING TIMING SLACK SENSORS

(71) Applicant: GLOBALFOUNDRIES INC., Grand Cayman (KY)

(72) Inventors: Sukeshwar Kannan, Malta, NY (US); Luke G. England, Saratoga Springs, NY (US); Mehdi Z. Sadi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/175,578

(22) Filed: Jun. 7, 2016

(51) Int. Cl.
| | |
|---|---|
| *H03K 3/011* | (2006.01) |
| *H03K 5/131* | (2014.01) |
| *H03L 7/197* | (2006.01) |
| *H03L 7/00* | (2006.01) |
| *H03K 5/14* | (2014.01) |
| *H03K 3/037* | (2006.01) |

(52) U.S. Cl.
CPC ............. *H03K 3/011* (2013.01); *H03K 3/037* (2013.01); *H03K 5/131* (2013.01); *H03K 5/14* (2013.01)

(58) Field of Classification Search
CPC ........ H03K 3/011; H03K 3/037; H03K 5/131; H03K 5/14; H04L 7/033; H03L 7/197; H03L 7/00
USPC .............. 327/2–12, 105–123, 141, 144–163; 331/15–17; 375/373–376
See application file for complete search history.

(56) References Cited

U.S. PATENT DOCUMENTS

| | | | |
|---|---|---|---|
| 5,379,299 A | 1/1995 | Schwartz | |
| 5,994,938 A * | 11/1999 | Lesmeister | ............ H03K 5/131 327/158 |
| 6,539,061 B1 * | 3/2003 | Easwar | ................ H04B 14/066 375/241 |
| 6,826,247 B1 * | 11/2004 | Elliott | .................... G09G 5/008 327/150 |
| 7,132,867 B1 * | 11/2006 | Rosen | ..................... H03L 7/093 327/150 |
| 7,246,252 B1 | 7/2007 | Gupta et al. | |
| 9,362,928 B1 * | 6/2016 | Goyal | ..................... H03L 7/081 |
| 2005/0138457 A1 * | 6/2005 | Gomm | ................. G11C 7/1072 713/401 |

(Continued)

OTHER PUBLICATIONS

Fick et al., In Situ Delay-Slack Monitor for High-Performance Processors Using an All-Digital Self-Calibrating 5ps Resolution Time-to-Digital Converter. Session 9 / Digital Circuits & Sensors 19.8. ISSCC (2010).

(Continued)

*Primary Examiner* — Brandon S Cole
(74) *Attorney, Agent, or Firm* — David Cain; Hoffman Warnick LLC

(57) ABSTRACT

A latency compensation circuit and method. A three dimensional (3D) package is disclosed having a latency compensation circuit to address timing delays introduced by a through silicon via (TSV), including: an input for receiving a reference data signal from a redundant TSV and for receiving a local clock signal; a timing slack sensor that outputs a digital value reflecting a delay between a clock pulse of the local clock signal and the reference data signal; a look-up table that converts the digital value into a set of control bits; and an adjustable delay line that adjusts the local clock signal based on the set of control bits.

20 Claims, 5 Drawing Sheets

(56) References Cited

U.S. PATENT DOCUMENTS

2009/0091360 A1* 4/2009 Heinimaki ............ H03K 5/133
327/116
2009/0219068 A1* 9/2009 Mizuhashi ............... G06F 1/10
327/158
2015/0280722 A1* 10/2015 Liu ...................... H03L 7/087
327/158

OTHER PUBLICATIONS

Lai et al., SlackProbe: A Low Overhead In Situ On-line Timing Slack Monitoring Methodology. UCLA Electrical Engineering Dept. (2013).

* cited by examiner

LATENCY COMPENSATION NETWORK USING TIMING SLACK SENSORS

BACKGROUND

Technical Field

The present disclosure relates to three dimensional integrated circuits (3D IC), and more specifically, to a 3D package having a latency compensation network using timing slack sensors.

Related Art

Three dimensional (3D) packages are manufactured by stacking silicon wafers and/or dies and interconnecting them vertically using through silicon vias (TSVs). For example, a 3D package may include a CPU tier and a memory tier. Using this approach, 3D packages behave as a single device that achieves performance improvements with reduced power and a smaller footprint than conventional two dimensional devices. Because of the proximity of the tiers, 3D packaging can, e.g., reduce off-chip main memory access latencies by 45-60%.

One of the associated challenges of 3D packaging is the potential introduction of delay faults that can occur between the different tiers. Defects, such as manufacturing variability, contamination, resistive open/shorts, etc., can result in an abnormally slow propagation of a signal from one tier to another. This type of defect can potentially violate the timing specification during at-speed operations and result in functional errors. Unfortunately, many such delay faults are not detectable by static tests, e.g., using stuck-at fault models.

SUMMARY

A first aspect of the disclosure is directed to a three dimensional (3D) package having a latency compensation circuit to address timing delays introduced by a through silicon via (TSV), including: an input for receiving a reference data signal from a redundant TSV and for receiving a local clock signal; a timing slack sensor that outputs a digital value reflecting a delay between a clock pulse of the local clock signal and the reference data signal; a look-up table that converts the digital value into a set of control bits; and an adjustable delay line that adjusts the local clock signal based on the set of control bits.

A second aspect of the disclosure includes a method for providing latency compensation in a three dimensional (3D) package to address timing delays introduced by a through silicon via (TSV), including: receiving a reference data signal and a local clock signal from a redundant TSV; using a timing slack sensor to output a digital value reflecting a delay between a clock pulse of the local clock signal and the reference data signal; using a look-up table to convert the digital value into a set of control bits; and adjusting the local clock signal with an adjustable delay line based on the set of control bits.

A third aspect of the disclosure includes a latency compensation circuit to address timing delays, including: an input for receiving a reference data signal and for receiving a local clock signal; a timing slack sensor that outputs a digital value reflecting a delay between a clock pulse of the local clock signal and the reference data signal; a look-up table that converts the digital value into a set of control bits; and an adjustable delay line that adjusts the local clock signal based on the set of control bits.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

A latency compensation network is provided for three dimensional (3D) package that includes a timing slack sensor for at-speed testing and an adjustable delay line circuit that regulates the clock signal.

Figure 1:
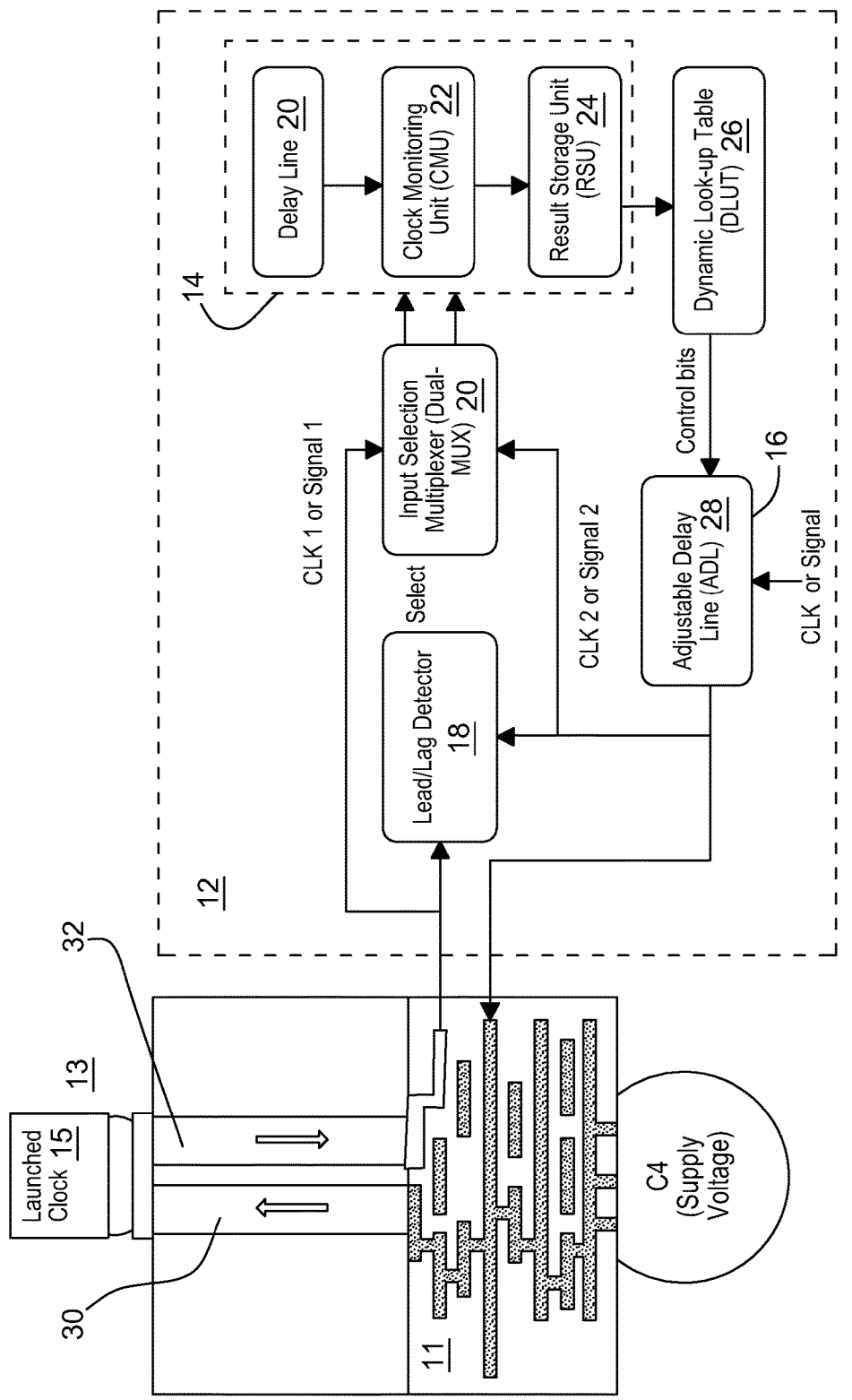
FIG. 1 shows the bottom tier/die of a 3D package having a latency compensation network according to embodiments of the disclosure.

FIG. 1 shows a 3D package 10 having a latency compensation network 12. 3D package 10 is shown having a bottom die 11 connected to a top die 13 via a micropillar structure that includes a signal TSV 30 and a redundant TSV 32 driven by a launched clock 15. Latency compensation network 12 adjusts a local clock signal CLK 1 being generated at the bottom die 11 to compensate for any signal delay introduced by signal TSV 30. To achieve this, latency compensation network 12 taps into the redundant TSV 32, which carries a data reference signal initially generated up the signal TSV 30 from the bottom die 11. The local clock signal CLK 1 may be locally generated in the bottom die 11 using, e.g., a phase locked loop (PLL) or a voltage controlled oscillator (VCO) circuit, or can be an external input from the board level through a C4 bump.

Regardless, both the local clock signal CLK 1 and a data reference signal (Signal 1) are input to a lead/lag detector 18 and input selection multiplexer 20, and forwarded to a timing slack sensor 14. Timing slack sensor 14 is a digital circuit that comprises a delay line 20, a clock monitoring unit 22 and a result storage unit 24, and determines a delay between a clock pulse of the local clock signal CLK 1 and the reference data signal (Signal 1). The delay, which is in digital format, is fed to a dynamic look-up table 26, which determines a set of control bits that are then fed to an adjustable delay line 28. The adjustable delay line 28 adds additional delay to the local clock signal CLK 1 to create an adjusted clock signal CLK 2 such that the arrival of data signal is synchronized with the rising edge of the clock pulse to ensure all bits are captured accurately.

The input selection multiplexer 20 can either select the output of the adjustable delay line 28 (i.e., adjusted clock signal CLK 2) or the local clock signal CLK 1 depending on whether or not a lead or lag is detected.

Figure 2:
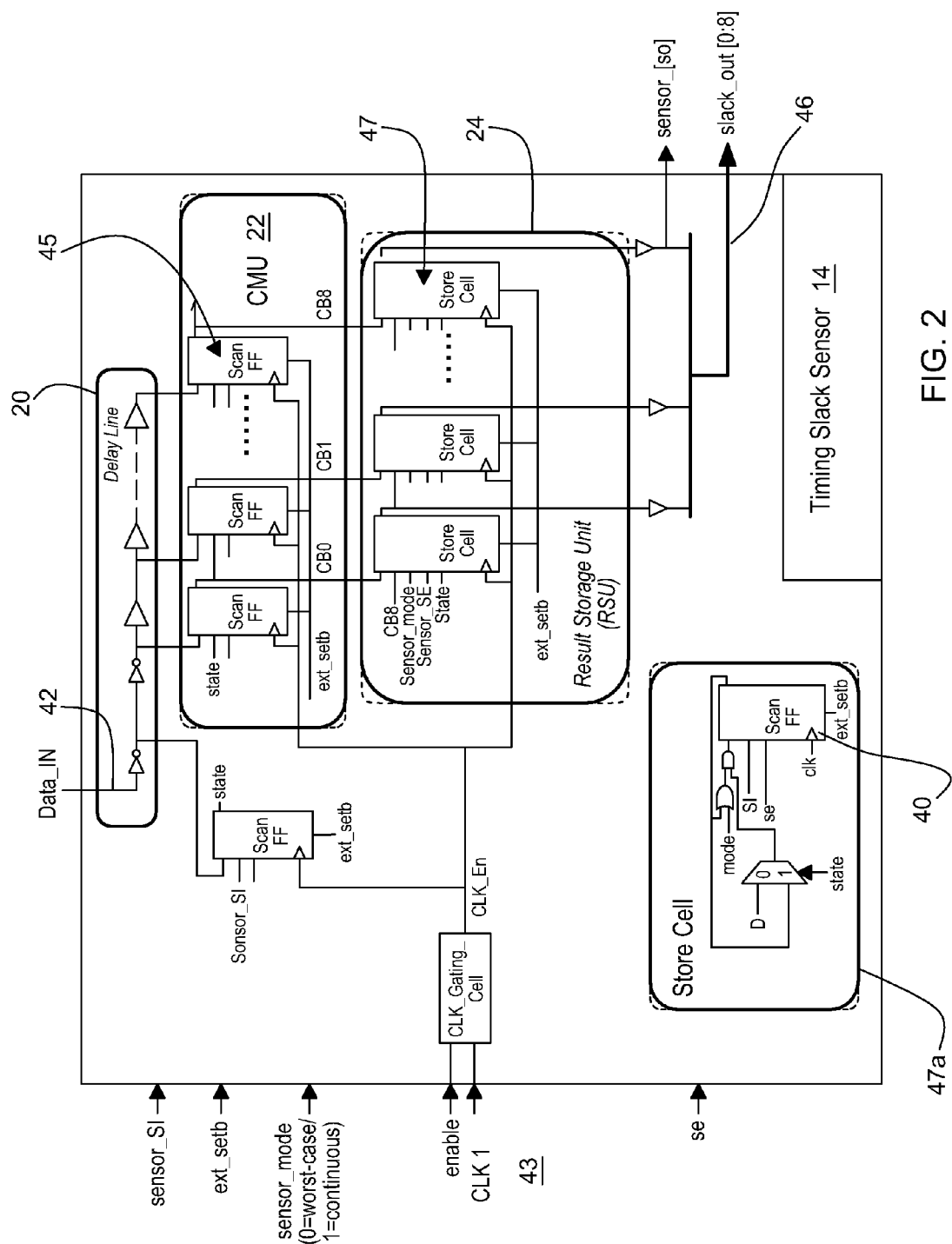
FIG. 2 shows a time slack sensor circuit according to embodiments of the disclosure.

FIG. 2 shows a more detailed view of the timing slack sensor 14. As can be seen, timing slack sensor 14 includes a delay line 20 that receives a data reference signal (Data_IN) 42, which is clocked in by local clock signal CLK 1. The amount or length of delay of the delay line 20 depends on the frequency of the associated clock pulse (i.e., the higher the frequency, the smaller the delay line). The delay is captured by a series of scan flip flops 45 in clock monitoring unit (CMU) 22. The binary data from the scan flip flops 45 are then stored by store cells 47 in the result storage unit 24, which records the delay of the local clock signal CLK 1 compared to the reference data signal 42. An example of a store cell 47a is shown, which utilizes a scan flip flop 40 to hold a bit of data. The output 46 of the timing slack sensor 14 is, e.g., an 8-bit output "slack_out."

Figure 3:
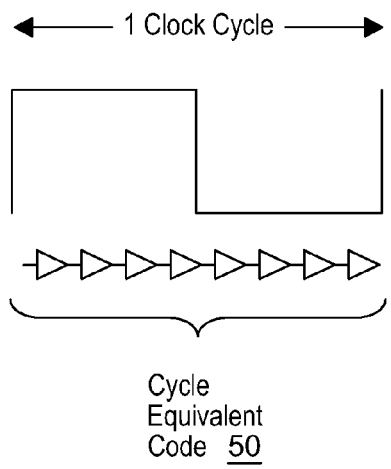
FIG. 3 shows a clock cycle length quantization according to other embodiments of the disclosure.
Figure 4:
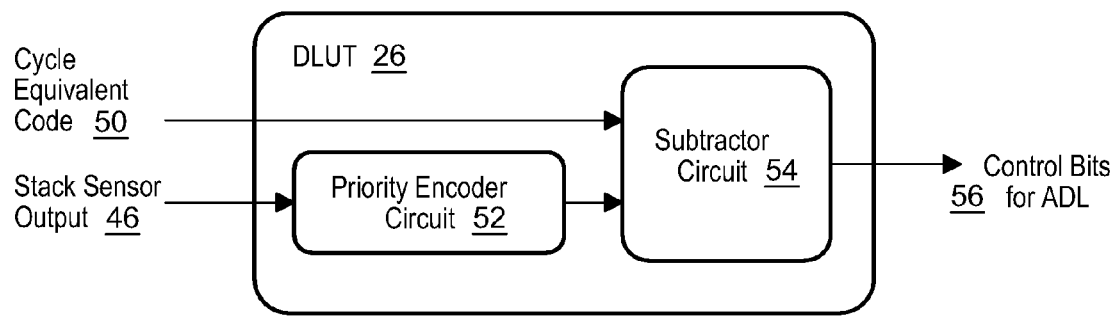
FIG. 4 shows a look up table according to embodiments of the disclosure.

FIG. 3 and FIG. 4 show an implementation of a dynamic look-up table (DLUT) 26. As shown in FIG. 4, the slack sensor output 46 is fed into a priority encoder circuit 52 which encodes the slack sensor output into a set of binary bits. The output of the priority encoder circuit and along with a cycle equivalent code 50 are fed to a subtractor circuit 54 that determines the "extra delay" required to synchronize the two signals, which are provided as control bits 56 for the adjustable delay line (ADL) 28. The cycle equivalent code 50 is a reconfigurable value that captures a quantized cycle clock length, determined, e.g., by an amount of buffer delay as shown in FIG. 3. The DLUT 26 can be adjusted externally to account for chip-to-chip process variations.

Figure 5:
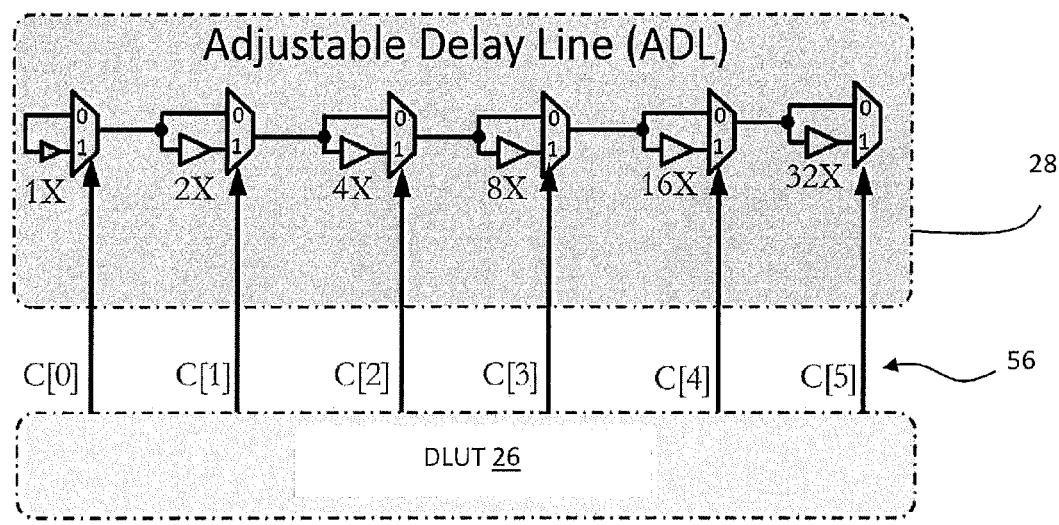
FIG. 5 shows an adjustable delay line circuit according to embodiments of the disclosure.

FIG. 5 is an example of an ADL 28 shown receiving the control bits 56 C[0], C[1], . . . C[5] from DLUT 26. DLUT 26 provides high precision adjustment delay using buffer size, without the use of a counter circuit to control delay as used in conventional delay locked loops. As shown, the control bits 56 select how much delay is to be imparted (e.g., 1×, 2×, . . . 32×). Combinations of delays can be used to create high precision, e.g., control bits 101000 result in a 1×+4×=5×delay. Using this fixed delay scheme, dithering across the locking point associated with a counter circuit is eliminated.

Figure 6:
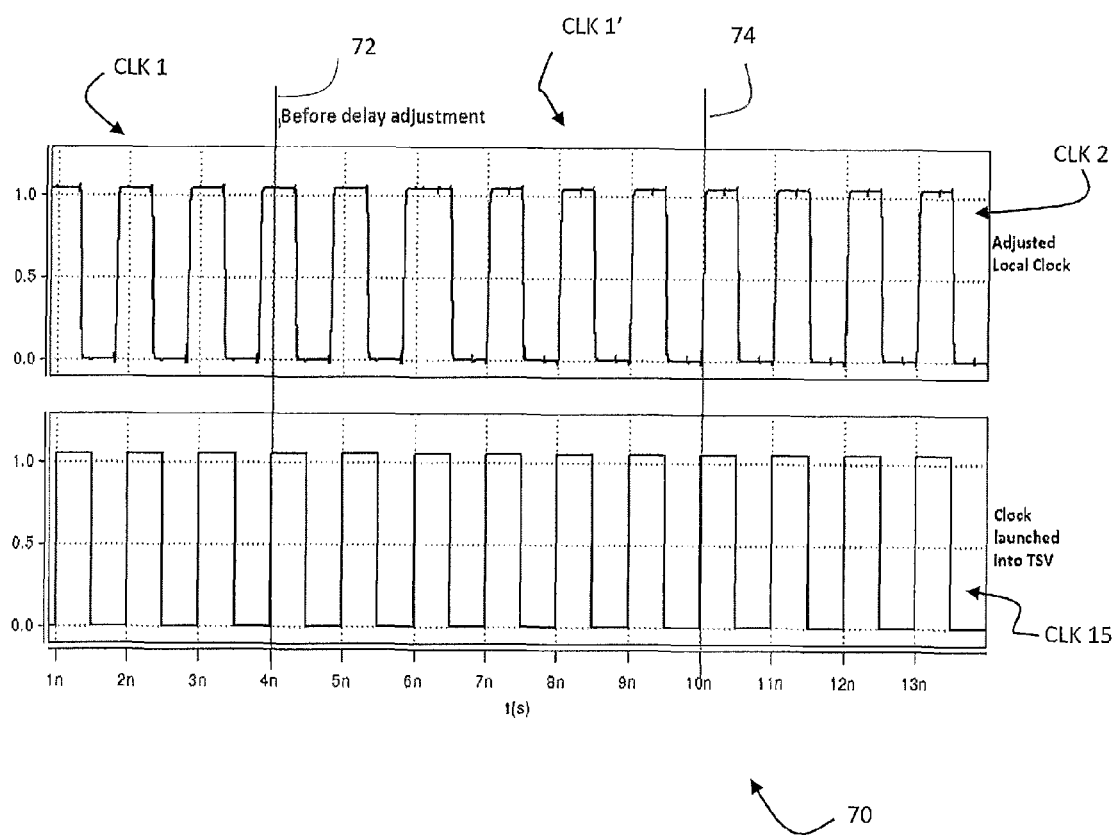
FIG. 6 shows a clock signal being adjusted according to embodiments of the disclosure.

FIG. 6 shows timing clock signals 70 depict the adjustment process. The bottom clock signal 15 shows the clock being launched up into the signal TSV 30 (FIG. 1) from the bottom tier 11. The top clock signal shows the local clock signal before adjustment (CLK 1), during adjustment CLK 1', and after adjustment CLK 2. As can be seen, before the delay adjustment 72, the local clock signal CLK 1 captured from the redundant TSV 32 lags behind the launched clock signal 15. Then for several cycles the clock signal CLK 1' is adjusted 74 until the local clock signal CLK 2 is synchronized with the launched clock cycle 15.

Accordingly, the described disclosure provides an automated latency compensation by adjusting the delay in a clock pulse with respect to a reference data signal to match with a rising edge pulse of the clock pulse. The use of dynamic lookup table (DLUT) 26 eliminates the need of a phase lock loop/dynamic lock loop set up in a closed loop system. This allows for the mitigation of chip-to-chip process variations with induced TSV-delay fluctuations by externally configuring the DLUT 26 at a manufacturing test phase. Dynamic data signal monitoring and a results storage unit using scan flip flops can also serve as at-speed tests circuits.

The resulting package can thus maintain data delivery to top die circuits within a timing specification to prevent functional fails (delay faults). Further, the latency compensation can be accomplished without phase detector and charge pump circuits to reduce size and the use of the DLUT 26 greatly reduces the time overhead.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The methods as described above are, e.g., used in the fabrication of integrated circuit chips, in a packaged form (3D package). The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A three dimensional (3D) package having a latency compensation circuit to address timing delays introduced by a through silicon via (TSV), comprising:
 a signal TSV extending from a first die to a second die of the 3D package;
 a redundant TSV extending from the first die to the second die;
 a launched clock driving the signal TSV and the redundant TSV;
 a reference data signal generated at the first die, passing from the first die to the second die through the signal TSV, and subsequently passing from the second die back to the first die through the redundant TSV;

an input for receiving a local clock signal and for receiving the reference data signal from the redundant TSV after the reference data signal has passed back to the first die through the redundant TSV;

a timing slack sensor that outputs a digital value reflecting a delay between a clock pulse of the local clock signal and the reference data signal caused by the passage of the reference data signal through the signal TSV;

a look-up table that converts the digital value into a set of control bits; and an adjustable delay line that adjusts the local clock signal based on the set of control bits.

2. The 3D package of claim 1, wherein the timing slack sensor includes a delay line that receives the reference data signal and outputs delay, wherein a length of the delay line is based on a frequency of the clock pulse.

3. The 3D package of claim 2, wherein the timing slack sensor further includes a clock monitoring unit having a plurality of scan flip flops that monitors the clock pulse with respect to the reference data signal.

4. The 3D package of claim 3, wherein the timing slack sensor further includes a result storage unit having a second plurality of scan flip flops that stores the delay of the clock pulse with respect to the reference data signal as the digital value.

5. The 3D package of claim 1, wherein the look-up table includes:
a priority encoder that inputs the digital value and generates a set of bits; and
a subtractor circuit that determines a difference between a digitized clock cycle length and the set of bits to provide the control bits for the adjustable delay line.

6. The 3D package of claim 1, wherein the timing sack sensor is disabled once the delay is determined.

7. The 3D package of claim 1, further comprising a lead/lag detector that determines if the reference data signal is leading or lagging the local clock signal.

8. The 3D package of claim 7, further comprising an input selection multiplexer coupled to the timing slack sensor.

9. A method for providing latency compensation in a three dimensional (3D) package to address timing delays introduced by a through silicon via (TSV), comprising:
generating a reference data signal at a first die of the 3D package;
passing the reference data signal through a signal TSV extending from the first die to a second die of the 3D package;
subsequently passing the reference data signal from the second die to the first die through a redundant TSV, the redundant TSV extending from the first die to the second die of the 3D package;
driving the signal TSV and the redundant TSV using a launched clock;
receiving a local clock signal and receiving the reference data signal from the redundant TSV after the reference data signal has passed back to the first die through the redundant TSV;
using a timing slack sensor to output a digital value reflecting a delay between a clock pulse of the local clock signal and the reference data signal caused by the passage of the reference data signal through the signal TSV;
using a look-up table to convert the digital value into a set of control bits; and
adjusting the local clock signal with an adjustable delay line based on the set of control bits.

10. The method of claim 9, wherein the timing slack sensor includes a delay line that receives the reference data signal and outputs delay data based on a frequency of the clock pulse.

11. The method of claim 10, wherein the timing slack sensor further includes a clock monitoring unit having a plurality of scan flip flops that monitors the clock pulse with respect to the reference data signal.

12. The method of claim 11, wherein the timing slack sensor further includes a result storage unit having a second plurality of scan flip flops that stores the delay of the clock pulse with respect to the reference data signal as the digital value.

13. The method of claim 9, wherein the look-up table includes:
a priority encoder that inputs the digital value and generates a set of bits; and
a subtractor circuit that determines a difference between a digitized clock cycle length and the set of bits to provide the control bits for the adjustable delay line.

14. The method of claim 9, wherein the timing slack sensor is disabled once the delay is determined.

15. The method of claim 9, wherein a lead/lag detector is provided to determine if the reference data signal is leading or lagging the local clock signal.

16. The method of claim 15, further comprising selecting between the local clock signal and the adjusted clock signal with an input selection multiplexer coupled to the timing slack sensor.

17. A latency compensation circuit to address timing delays in a three dimensional (3D) package introduced by a through silicon via (TSV), comprising
a signal TSV extending from a first die to a second die of the 3D package;
a redundant TSV extending from the first die to the second die;
a launched clock driving the signal TSV and the redundant TSV;
a reference data signal generated at the first die, passing from the first die to the second die through the signal TSV, and subsequently passing from the second die back to the first die through the redundant TSV;
an input for receiving a local clock signal and the reference data signal from the redundant TSV after the reference data signal has passed back to the first die through the redundant TSV;
a timing slack sensor that outputs a digital value reflecting a delay between a clock pulse of the local clock signal and the reference data signal caused by the passage of the reference data signal through the signal TSV;
a look-up table that converts the digital value into a set of control bits; and
an adjustable delay line that adjusts the local clock signal based on the set of control bits.

18. The latency compensation circuit of claim 17, wherein the timing slack sensor includes a delay line that receives the reference data signal and outputs delay, wherein a length of the delay line is based on a frequency of the clock pulse.

19. The latency compensation circuit of claim 18, wherein the timing slack sensor further includes a clock monitoring unit having a plurality of scan flip flops that monitors the clock pulse with respect to the reference data signal.

20. The latency compensation circuit of claim 19, wherein the timing slack sensor further includes a result storage unit having a second plurality of scan flip flops that stores the delay of the clock pulse with respect to the reference data signal as the digital value.

\* \* \* \* \*